United States Patent
Kim et al.

(10) Patent No.: US 7,825,710 B2
(45) Date of Patent: Nov. 2, 2010

(54) DELAY-LOCKED LOOP CIRCUITS AND METHOD FOR GENERATING TRANSMISSION CORE CLOCK SIGNALS

(75) Inventors: Nam-Seog Kim, Suwon-si (KR); Uk-Rae Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/371,555

(22) Filed: Mar. 9, 2006

(65) Prior Publication Data

US 2006/0238227 A1 Oct. 26, 2006

(30) Foreign Application Priority Data

Apr. 26, 2005 (KR) .................... 10-2005-0034348

(51) Int. Cl.
*H03L 7/06* (2006.01)

(52) U.S. Cl. .................... 327/158; 327/160; 327/161

(58) Field of Classification Search ................ 327/158, 327/160, 161
See application file for complete search history.

(56) References Cited

U.S. PATENT DOCUMENTS

| | | | | |
|---|---|---|---|---|
| 5,485,490 A | * | 1/1996 | Leung et al. ............... 375/371 |
| 6,094,082 A | * | 7/2000 | Gaudet ...................... 327/270 |
| 6,121,808 A | * | 9/2000 | Gaudet ...................... 327/231 |
| 6,125,157 A | * | 9/2000 | Donnelly et al. ............ 375/371 |
| 6,359,486 B1 | * | 3/2002 | Chen ......................... 327/231 |
| 6,674,314 B2 | * | 1/2004 | Takai ......................... 327/158 |
| 6,707,727 B2 | | 3/2004 | Tamura et al. ............... 365/192 |
| 6,727,741 B2 | | 4/2004 | Huang et al. ................ 327/258 |
| 6,812,759 B2 | * | 11/2004 | Suzuki ....................... 327/158 |
| 6,847,241 B1 | * | 1/2005 | Nguyen et al. .............. 327/158 |
| 7,061,224 B2 | * | 6/2006 | Kakizawa et al. .......... 324/76.54 |
| 7,215,596 B2 | * | 5/2007 | Jeong ......................... 365/233 |
| 7,221,724 B2 | * | 5/2007 | Schell ........................ 375/355 |

* cited by examiner

*Primary Examiner*—Kenneth B. Wells
(74) *Attorney, Agent, or Firm*—F. Chau & Associates, LLC

(57) ABSTRACT

A delay-locked loop (DLL) circuit and a method for generating transmission core clock signals are provided, where the DLL circuit receives an applied external clock signal and generates a transmission core clock signal, the DLL circuit includes a delay circuit unit and a transmission core clock signal generating unit, the delay circuit unit delays the external clock signal through a plurality of delay units configured in a chain type and outputs a plurality of reference clock signals having different phases, the transmission core clock signal generating unit independently selects and controls two reference signals from the plurality of reference clock signals and thus independently generates transmission core clock signals by the number corresponding to ½ times the number of reference clock signals, and the transmission core clock signals have different phases and a period equal to a period of the external clock signal, wherein transmission core clock signals having a precise phase difference are generated individually and independently.

20 Claims, 8 Drawing Sheets

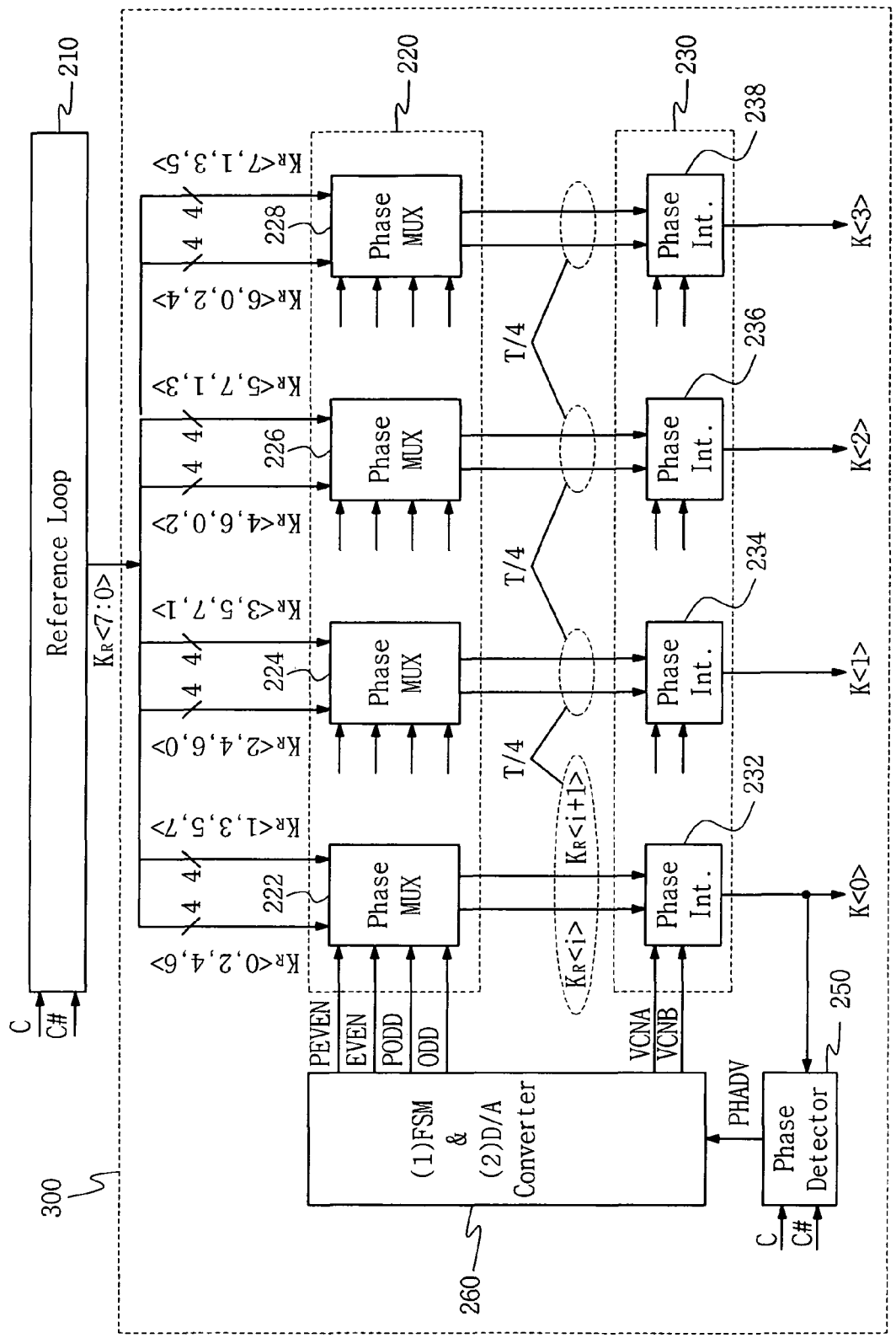

DELAY-LOCKED LOOP CIRCUITS AND METHOD FOR GENERATING TRANSMISSION CORE CLOCK SIGNALS

CROSS-REFERENCE TO RELATED APPLICATION

This application claims foreign priority under 35 U.S.C. §119 to Korean Patent Application No. 10-2005-0034348, filed on Apr. 26, 2005, in the Korean Intellectual Property Office, which is herein incorporated by reference in its entirety.

BACKGROUND

The present disclosure relates to semiconductor memory devices. More particularly, the present disclosure relates to a delay-locked loop (DLL) circuits for generating transmission core clock signals used in semiconductor memory devices.

Rapid development in semiconductor technology has brought about successful developments for digital systems such as personal computers, Portable Digital Assistants (PDA) or portable communication systems. However, an operating speed of peripheral devices could not overtake an operating speed of microprocessors in spite of an improved transmission rate of data and an improved operating speed of peripheral devices such as memories and communication devices. There has been a speed difference between new microprocessors and their peripheral devices or graphic devices, thus a remarkable improvement of speed on peripheral devices is required in high-performance digital systems.

One solution to improve speeds of peripheral devices is to add a synchronous interface to the peripheral devices. Synchronous memory devices such as synchronous DRAM or SRAM can be provided as typical examples of the synchronous peripheral devices.

In particular, in a synchronous semiconductor memory device employing a double data rate (DDR) system, an output data window of such a memory device is getting smaller according to an increasingly increased signal speed. Respective components constituting a semiconductor memory device are required to output a source synchronous clock such as an echo clock in order to span a data window; and to obtain a precise data sampling, the source synchronous clock is required to position on a center of output data and to become 50% in duty ratio.

To control a precise transmission and/or reception of source clock signal and data, a transmission core clock signal having four phases is needed. In general a phase-locked loop (PLL) or delay-locked loop (DLL) circuit is needed to generate core clock signals having such four phases. The phase locked loop circuit is sensitive to jitter of the input clock signal, is greatly affected by internal noise, and is unstable as compared with the delay-locked loop circuit. The delay-locked loop circuit is thus widely used for synchronous semiconductor memory devices.

FIG. 1 is a timing diagram schematically illustrating a transmission/reception of data by using a transmission core clock signal in a semiconductor memory device of a DDR system. Referring to FIG. 1, first data transmitted and received through a data pad DQ starts on the transmission/reception in response to a first core clock signal K<0>. An echo clock CQ,CQ\ is generated in response to a second core clock signal K<1>, which is later by 90 degrees in phase than the first core clock signal K<0>. At this time the center of the data is placed at a rising edge or falling edge of the echo clock CQ,CQ\.

A transmission/reception of second data is begun in response to a third core clock signal K<2> that is later by 90 degrees in phase than the second core clock signal K<1>. A center of the second data is placed on a rising edge or falling edge of the echo clock CQ,CQ\ in response to a fourth core clock signal K<3> that is later by 90 degrees in phase than the third core clock signal K<2>. Thus, a sampling of data can be obtained precisely. To obtain such precise sampling and transmission/reception of data, the core clock signals K<0>, K<1>, K<2> and K<3> should have a precise phase difference without defects.

FIG. 2 illustrates as an example of a DLL circuit to generate such four core clock signals according to a conventional approach. As shown in FIG. 2, a DLL circuit, as an example of a conventional approach, includes a reference loop 10, a phase multiplexer (MUX) unit 20, an interpolation unit 30, a DCC unit 40, a phase detector 50 and a controller 60.

The reference loop 10 equally divides a delay time corresponding to a period T of an external clock signal C,C# as an input clock. In other words, the external clock signal C,C# is delayed through the plurality of delay units, and reference clock signals KR<0,1,2,3,4,5,6,7> are generated. For example, in dividing a period T of the external clock signal C,C# into eight equal parts, one delay unit delays the external clock signal C,C# by T/8. A signal passed through one delay unit is delayed by T/8, and a signal passed through two delay units is delayed by T/4. A signal passed through n-number of delay units is delayed by nT/8 for the external clock signal C,C#, wherein n is a natural number of not less than 1. Thus a plurality of reference clock signals KR<0,1,2,3,4,5,6,7> having mutually different delays are outputted.

The phase MUX unit 20 includes two phase multiplexer (MUX) circuits. The phase MUX circuits are simultaneously controlled by selection control signals PEVEN, EVEN, PODD and ODD. The respective phase multiplexer circuits respectively select two reference clock signals among the reference clock signals KR<0,1,2,3,4,5,6,7> in response to the selection control signals PEVEN, EVEN, PODD and ODD. For example, when a first phase MUX circuit of the two phase MUX circuits selects a first reference clock signal KR<0> and a second reference clock signal KR<1>, a second phase MUX circuit selects a third reference clock signal KR<2> having a phase difference of T/4 from the first reference clock signal KR<0> selected by the first phase MUX circuit and a fourth reference clock signal KR<3> having a phase difference of T/4 from the second reference clock signal KR<1>. This is why the phase MUX circuits are configured to select a clock signal most approximate to the external clock signal C,C# in response to the same selection control signals PEVEN, EVEN, PODD and ODD applied from the controller 60.

The interpolation unit 30 includes two phase interpolators. A first interpolator circuit of the two phase interpolators generates a first interpolation signal, having an optional phase value provided between two selected reference clock signals, in response to interpolator control signals VCNA and VCNB applied from the controller 60. Here, the two selected reference clock signals are, for example, a first reference clock signal KR<0> and a second reference clock signal KR<1> selected by the first phase MUX circuit. A second interpolator circuit generates a second interpolation signal having an optional phase value provided between two reference signals selected by the second phase MUX circuit. Here, the two reference signals being, for example, a third reference clock signal KR<2> and a fourth reference clock signal KR<3>. The first and second interpolation signals are controlled to have a phase difference of T/4.

The DCC unit 40 includes two Duty Cycle Correction (DCC) circuits, and corrects so that duty cycles of the first and second interpolation signals become 50%, thus individually generating a first internal clock signal K0 and a second internal clock signal K1. The phase detector 50 compares phases of the first internal clock signal K0 and the external clock signal C,C#, and applies a detection signal PHADV corresponding to its difference to the controller 60.

The controller 60 includes a Final State Machine (FSM) circuit having a counter and a Digital-to-Analog (D/A) converter circuit, and generates selection control signals PEVEN, EVEN, PODD and ODD and interpolator control signals VCNA and VCNB in response to a detection signal PHADV applied from the phase detector 50, so as to control the phase MUX unit 20 and the interpolation unit 30.

FIG. 3 illustrates a first internal clock signal K0 and a second internal clock signal K1 referred to in FIG. 2. As shown in FIG. 3, the DLL circuit shown in FIG. 2 according to a conventional approach generates two internal clock signals K0 and K1, and takes roles of four transmission core clock signals through rising edges and falling edges of two internal clock signals K0 and K1. In other words, a rising edge time point of a first internal clock signal K0 is used as a first transmission core clock signal K<0>, and a rising edge time point of a second internal clock signal K1 later by T/4 in phase than that of the first internal clock signal K0 is used as a second transmission core clock signal as K<1>. A falling edge time point of the first internal clock signal K0 is used as a third transmission core clock signal K<2>, and a falling edge time point of the second internal clock signal K1 is used as a fourth transmission core clock signal K<3>.

FIG. 4 illustrates another example of a DLL circuit to generate such four core clock signals. Referring to FIG. 4, a DLL circuit as another example of a conventional approach includes a reference loop 110, a phase MUX unit 120, an interpolation unit 130, a delay unit 134, a DCC unit 140, a phase detector 150 and a controller 160.

The reference loop 110 equally divides a delay time corresponding to a period T of an external clock signal C, C# provided as an input clock, and the external clock signal C,C# is delayed through a plurality of delay units, and reference clock signals $K_R<0,1,2,3,4,5,6,7>$ are generated. For example, in dividing the period T of the external clock signal C, C# into eight equal parts, one delay unit delays the external clock signal C, C# by T/8. A signal passed through one delay unit is delayed by T/8. A signal passed through two delay units is delayed by T/4. A signal passed through the n number of delay units is delayed by nT/8 for the external clocks signal C, C#, wherein n is a natural number of not less than 1. Accordingly a plurality of reference clock signals $K_R<0,1,2,3,4,5,6,7>$ having mutually different delays are outputted.

The phase MUX unit 120 has one phase MUX circuit contrary to the case of FIG. 2. The phase MUX circuit is controlled by selection control signals PEVEN, EVEN, PODD and ODD outputted from the controller 160. The phase MUX circuit selects two reference clock signals from the reference clock signals $K_R<0,1,2,3,4,5,6,7>$ in response to the selection control signals PEVEN, EVEN, PODD and ODD. For example the phase MUX circuit selects a first reference clock signal $K_R<0>$ and a second reference clock signal $K_R<1>$. This is why the phase MUX circuits are configured to select a clock signal most approximate to the external clock signal C, C# in response to the same selection control signals PEVEN, EVEN, PODD and ODD applied from the controller 160.

The interpolation unit 130 has one phase interpolator circuit. The phase interpolator circuit generates a first interpolation signal having an optional phase value provided between two reference clock signals selected by the phase MUX circuit, in response to interpolator control signals VCNA and VCNB applied from the controller 160. For example, the first reference clock signal may be $K_R<0>$ and the second reference clock signal may be $K_R<1>$. The delay unit 134 delays the first interpolation signal by a phase of T/4. The DCC unit 140 includes two Duty Cycle Correction (DCC) circuits. The DCC circuits correct so that the first interpolation signal and a delay signal passed through the delay unit 134 have a duty cycle of 50%, and individually generate a first internal clock signal K0 and a second internal clock signal K1.

The phase detector 150 compares phases of the first internal clock signal K0 and the external clock signal C,C#, and applies a detection signal PHADV corresponding to its difference to the controller 160. The controller 160 includes a Final State Machine (FSM) circuit having a counter and a D/A converter circuit, and generates selection control signals PEVEN, EVEN, PODD and ODD and interpolator control signals VCNA and VCNB in response to a detection signal PHADV applied from the phase detector 50, so as to control the phase MUX unit 120 and the interpolation unit 130.

Exemplary internal clock signals K0 and K1 are shown in FIG. 5. Beneficially, the first and second internal clock signals K0 and K1 shown in FIG. 5 have the same function as those of FIG. 3.

Such DLL circuits according to a conventional approach have an error occurrence possibility because of the use of rising edges and falling edges of the first internal clock signal K0 and the second internal clock signal K1 provided as transmission core clock signals. A clock tree to generate an internal clock signal is lengthened by employing a DCC circuit. Thus, a clock buffer is additionally needed in the DLL circuit and/or on an end of clock tree, and errors may be caused. Furthermore, a DCC circuit has a limitation in correcting a duty cycle of an input clock signal, and it is difficult to generate four transmission core clock signals having a precise phase difference due to errors of the DCC circuit itself, etc.

In addition, in cases such as the DLL circuit shown in FIG. 4, error occurrence may become high when a delay control is not precise in the delay unit. Thus, a DLL circuit to generate transmission core clock signals having a precise phase difference, and to reduce error occurrence as compared with such conventional circuits, is desired.

SUMMARY OF THE INVENTION

An exemplary embodiment of the present disclosure provides a delay-locked loop (DLL) circuit and a method of generating a transmission core clock signal. The DLL circuit does not require a DCC (Duty Cycle Correction) circuit. The circuit and method reduce phase error of transmission core clock signals. The circuit and method can be controlled easily in generating a transmission core clock signal.

According to one aspect of the disclosure, a DLL circuit for receiving an applied external clock signal and generating a transmission core clock signal comprises a delay circuit unit for delaying the external clock signal through a plurality of delay units configured in a chain type and outputting a plurality of reference clock signals having different phases; and a transmission core clock signal generating unit for independently selecting and controlling two reference signals from the plurality of reference clock signals and thus independently generating transmission core clock signals by a number corresponding to ½ times the number of reference clock signals, the transmission core clock signals having different phases and the same cycle as a cycle of the external clock signal.

A delay time corresponding to a period of the external clock signal is divided equally through the plurality of delay units constituting the delay circuit unit, and the equally divided delays are individually performed through the plurality of delay units. The transmission core clock signal generating unit may comprise a phase MUX unit having a plurality of phase MUX circuits for independently selecting and outputting two reference clock signals most approximate to the external clock signal from the reference clock signals, respectively, in response to the same applied selection control signals; an interpolation unit having a plurality of phase interpolators for independently outputting transmission core clock signals having a specific phase provided between the selected two reference clock signals, respectively, in response to the same applied interpolator control signals; a phase detector for comparing a phase of a transmission core clock signal outputted from any one interpolator selected from the phase interpolators with a phase of the external clock signal, and outputting a detection signal corresponding to its phase difference; and a controller for generating the selection control signals and the interpolator control signals in response to a detection signal of the phase detector.

Each of the plurality of phase MUX circuits can individually select any one of reference clock signals passed through an even-number delay unit of the delay circuit unit and any one of reference clock signals passed through an odd-number delay unit of the delay circuit unit, from the reference clock signals. Two reference clock signals selected by any one of the plurality of phase MUX circuits may be an input signal and an output signal of any one delay unit selected from the plurality of delay units.

The controller can include an FSM circuit that has a counter and that generates the selection control signals in response to a detection signal of the phase detector, and a D/A converter circuit for generating the interpolator control signals in response to a portion of output signals outputted from the counter of the FSM circuit.

According to another aspect of the disclosure, a DLL circuit for receiving an external clock signal and generating transmission core clock signals comprises a delay circuit unit, a phase MUX unit, an interpolation unit, a phase detector and a controller.

The delay circuit unit includes eight delay units that are configured in a chain type to equally divide a delay time corresponding to a period of the external clock signal and to perform the delays, and generates each of first to eighth reference clock signals having different phases after the external clock signal is passed through the respective delay units.

The phase MUX unit includes a first phase MUX circuit for selecting two reference clock signals having a phase difference most approximate to the external clock signal from the reference clock signals; a second phase MUX circuit for selecting two reference clock signals having a phase difference most approximate to the external clock signal, from the rest reference clock signals not selected by the first phase MUX circuit; a third phase MUX circuit for selecting two reference clock signals having a phase difference most approximate to the external clock signal, from the rest reference clock signals not selected by the first and second phase MUX circuits; and a fourth phase MUX circuit for selecting the rest two reference clock signals not selected by the first to third phase MUX circuits, wherein the first to fourth phase MUX circuits have the same structure and are controlled by the same selection control signals.

The interpolation unit includes a first phase interpolator circuit for interpolating two reference clock signals outputted from the first phase MUX circuit and outputting a first transmission core clock signal; a second phase interpolator circuit for interpolating two reference clock signals outputted from the second phase MUX circuit and outputting a second transmission core clock signal; a third phase interpolator circuit for interpolating two reference clock signals outputted from the third phase MUX circuit and outputting a third transmission core clock signal; and a fourth phase interpolator circuit for interpolating two reference clock signals outputted from the fourth phase MUX circuit and outputting a fourth transmission core clock signal, wherein the first to fourth phase interpolator circuits are controlled by the same interpolator control signals.

The phase detector compares phases of the first transmission core clock signal and the external clock signal, and outputs a detection signal corresponding to its phase difference. The controller generates the selection control signals and the interpolator control signals in response to a detection signal of the phase detector.

The first and second reference clock signals, the second and third reference clock signals, the third and fourth reference clock signals, the fourth and fifth reference clock signals, the fifth and sixth reference clock signals, the sixth and seventh reference clock signals, the seventh and eighth reference clock signals, and the eighth and first reference clock signals, may individually have a phase difference of 45 degrees.

Two reference clock signals selected by any one of the first to fourth phase MUX circuits may be an input signal and an output signal of any one selected from the eight delay units. The first and second transmission core clock signals, the second and third transmission core clock signals, the third and fourth transmission core clock signals, and the fourth and fifth transmission core clock signals, may individually have a phase difference of 90 degrees.

According to another aspect of the disclosure, a method of receiving an external clock signal and generating transmission core clock signals in a DLL circuit comprises delaying the external clock signal through each of a plurality of delay units and generating a plurality of reference clock signals passed through the delay units; and respectively selecting two reference clock signals having a phase difference most approximate to the external clock signal, from the plurality of reference clock signals, and interpolating the signals, and independently generating a plurality of transmission core clock signals having different phases and having the same cycle as the external clock signal.

Through the plurality of delay units, a delay time corresponding to a period of the external clock signal is divided into equal parts and the delays are performed respectively. The two selected reference clock signals may be an input signal and an output signal of any one selected from the plurality of delay units.

The transmission core clock signals can be applied to a semiconductor memory device having a DDR function. Such configurations can reduce error occurrences and perform an easy control in controlling the same control signals.

BRIEF DESCRIPTION OF THE DRAWINGS

The present disclosure will become more fully understood from the detailed description given herein below and the accompanying drawings, which are given by way of illustration only and thus are not limitative of the present invention, wherein:

FIG. 6 is a block diagram of a DLL circuit according to an exemplary embodiment of the disclosure;

DETAILED DESCRIPTION OF PREFERRED EMBODIMENTS

Figure 1:
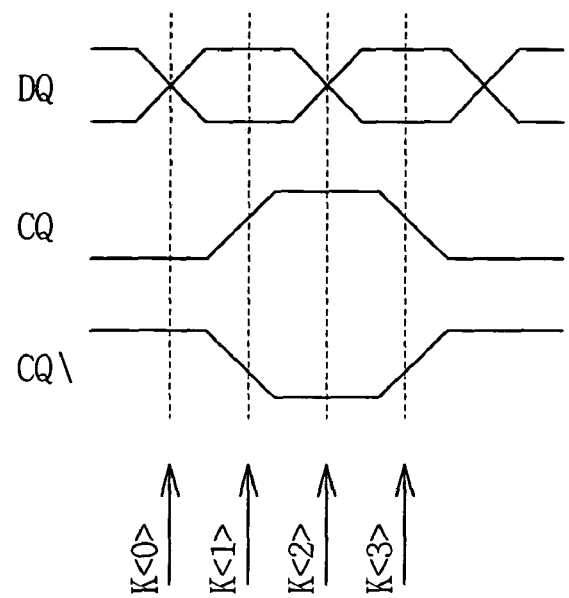
FIG. 1 schematically illustrates a timing to transmit and receive data by using a transmission core clock signal in a semiconductor memory device of a DDR system according to a conventional approach.
Figure 3:
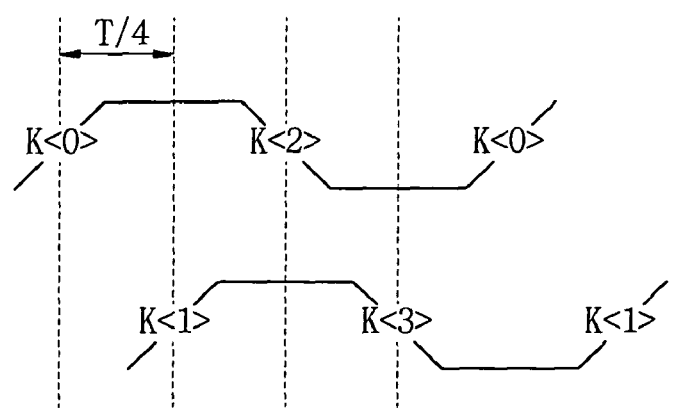
FIG. 3 illustrates a timing of internal clock signal shown in FIG. 2.
Figure 2:
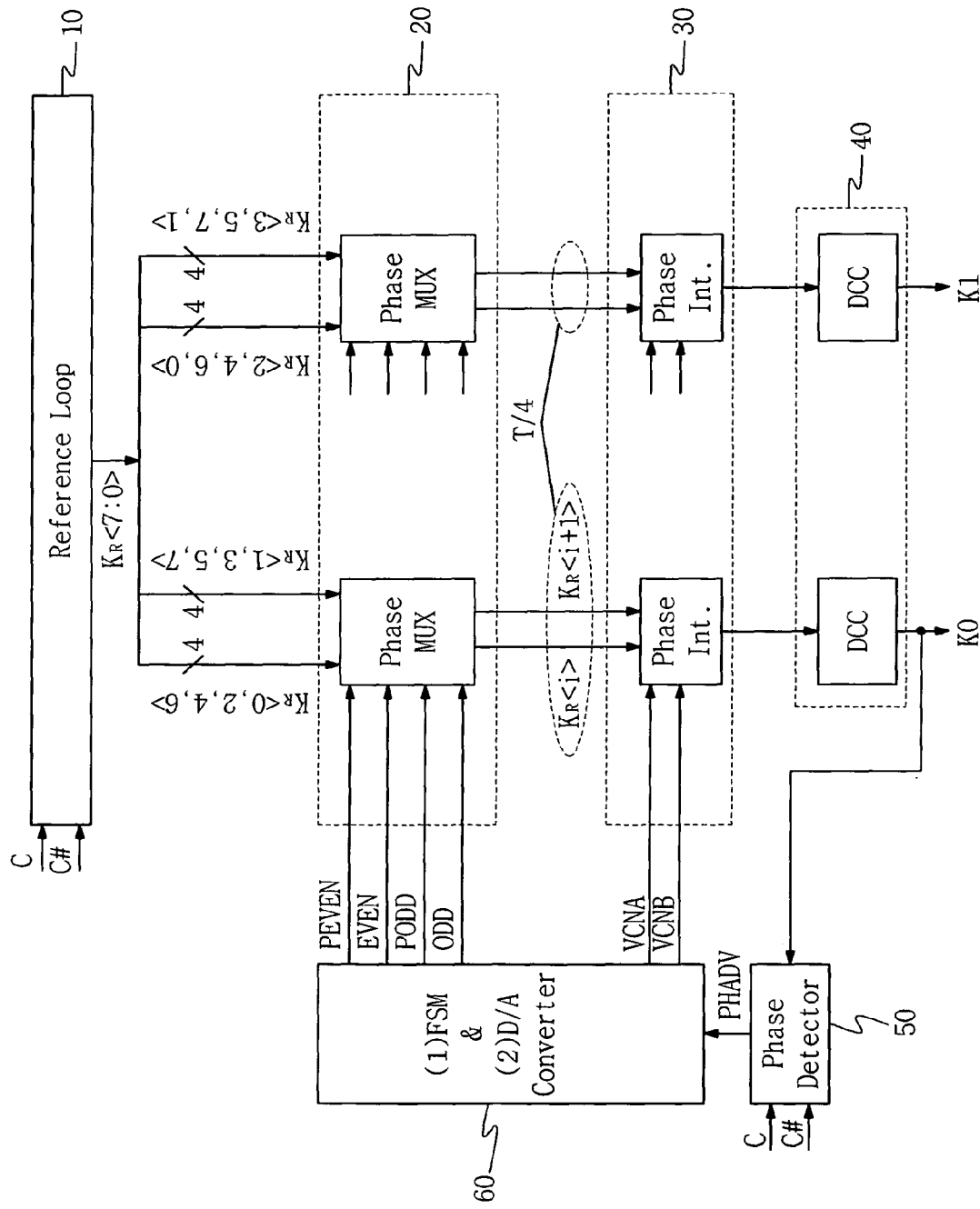
FIG. 2 is a block diagram illustrating one example of a DLL circuit according to a conventional approach.
Figure 4:
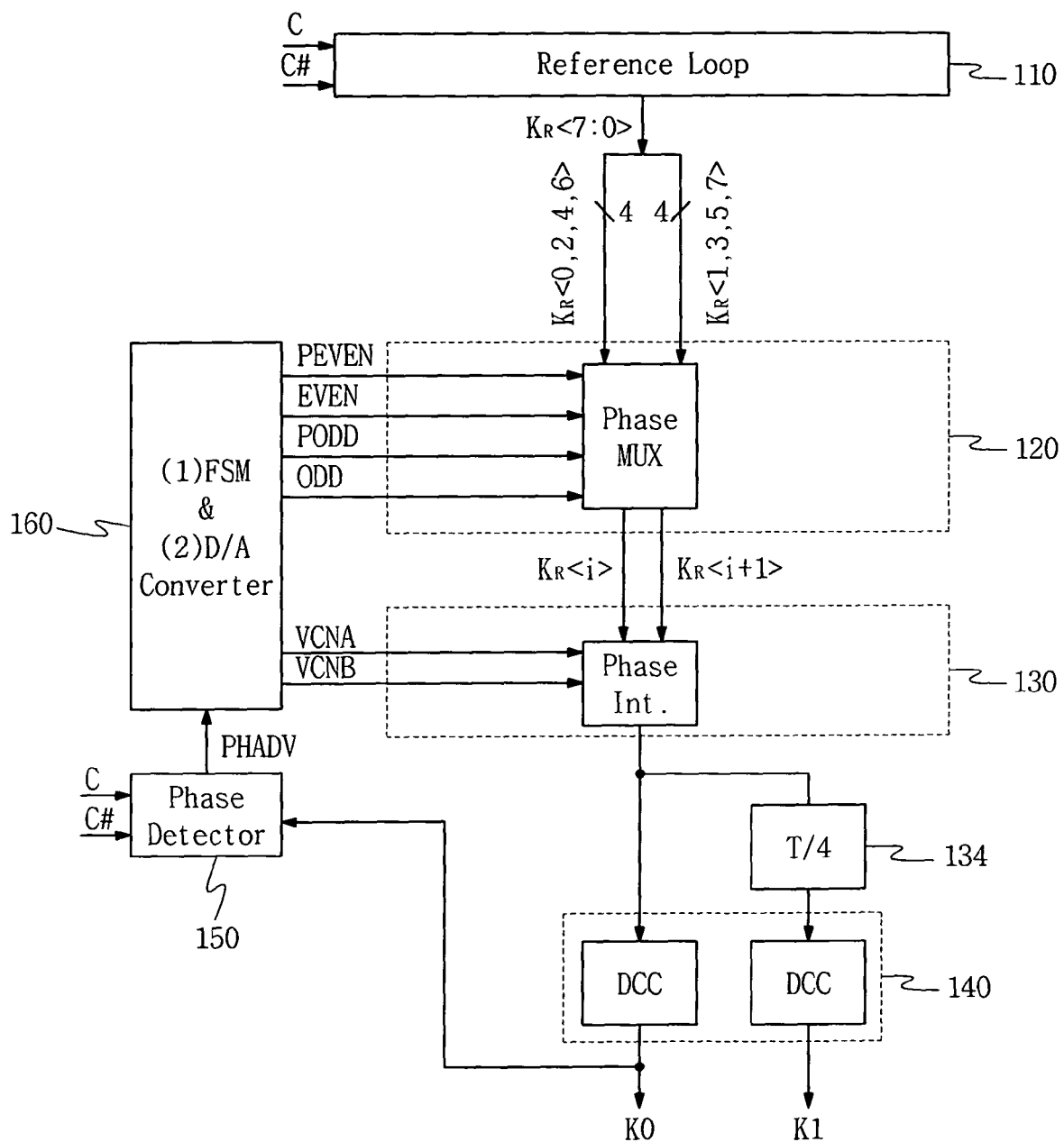
FIG. 4 is a block diagram illustrating another example of DLL circuit according to a conventional approach.
Figure 5:
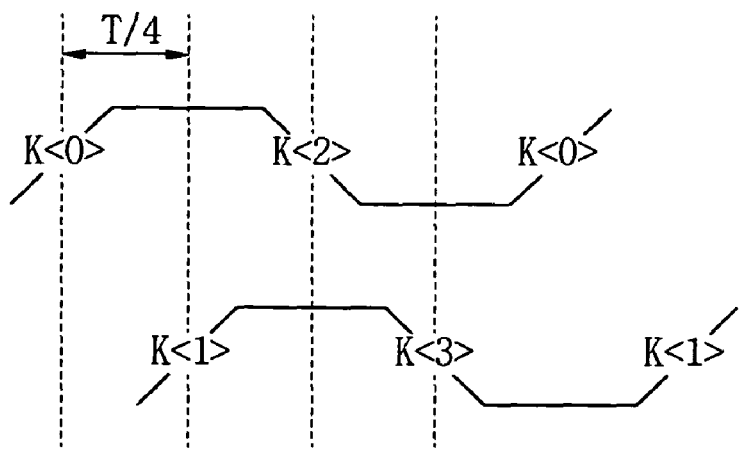
FIG. 5 illustrates a timing of internal clock signal shown in FIG. 4.

The present disclosure provides a delay-locked loop (DLL) circuit and a method for generating all transmission core clock signals used in a semiconductor memory device without employing a duty cycle correction (DCC) circuit. Hereinafter, exemplary embodiments of the present disclosure will be described in detail with reference to FIGS. 6 to 10. It will be understood by those of ordinary skill in the pertinent art that the present invention can be embodied in numerous different forms and is not limited to the following described embodiments. The following embodiments are exemplary in nature.

FIG. 6 is a block diagram of a delay-locked loop (DLL) circuit according to an exemplary embodiment of the disclosure. Referring to FIG. 6, a DLL circuit includes a delay circuit unit 210 and a transmission core clock signal generating unit 300. The delay circuit unit 210 delays an external clock signal C,C# applied through a plurality of delay units configured in a chain type, and outputs a plurality of reference clock signals $K_R$<7:0> having different phases.

The transmission core clock signal generating unit 300 independently selects and controls two reference signals from the plurality of reference clock signals KR<7:0>, and thus independently generates transmission core clock signals K<0>, K<1>, K<2> and K<3> by a number corresponding to ½ times the number of the reference clock signals KR<7:0>. The transmission core clock signals K<0>, K<1>, K<2> and K<3> have different phases, and have the same cycle as a period T of the external clock signal C,C#. The transmission core clock signal generating unit 300 includes a phase MUX unit 220, an interpolation unit 230, a phase detector 250 and a controller 260, which constitute a loop circuit.

The delay circuit unit 210 can be called a reference loop, and includes a plurality of delay units configured in a chain type. Through the plurality of delay units, a delay time corresponding to a period T of the external clock signal C,C# is divided into equal parts, and the delays are performed respectively. For example, supposing that a period of the external clock signal C,C# is 2 ns and the delay circuit unit 210 is constructed of eight delay units, a delay amount processed by one delay unit is 0.25 ns. A signal passed through one delay unit is delayed by T/8 as 45 degrees, and a signal passed through two delay units is delayed by T/4 as 90 degrees. A signal passed through the n number of delay units has a delay of nT/8 for the external clock signal C,C#. Thus a plurality of reference clock signals $K_R$<7:0> having different delays are outputted.

The phase MUX unit 220 includes a plurality of phase MUX circuits 222, 224, 226 and 228, to independently select and output two reference clock signals most approximate to the external clock signal from the reference clock signals $K_R$<7:0>, respectively, in response to the same applied selection control signals PEVEN, EVEN, PODD and ODD. The phase MUX unit 220 may include, for example, four phase MUX circuits 222, 224, 226 and 228. Each of the respective phase MUX circuits 222, 224, 226 and 228 may be constructed of two Complementary Metal-Oxide Semiconductor (CMOS) 4:1 MUX circuits.

A first phase MUX circuit 222 from the four phase MUX circuits 222, 224, 226, 228 selects two reference clock signals, e.g., $K_R$<0,1>, having a phase difference most approximate to the external clock C,C#. A second phase MUX unit 224 selects two reference clock signals, e.g., $K_R$<2,3>, having a phase difference most approximate to the external clock signal C,C#, from the rest of the reference clock signals, e.g., $K_R$<2,3,4,5,6,7>, not selected by the first phase MUX circuit 224. A third phase MUX circuit 226 selects two reference clock signals, e.g., $K_R$<4,5>, having a phase difference most approximate to the external clock signal C,C#, from the rest of the reference clock signals, e.g., $K_R$<4,5,6,7>, not selected by the first and second phase MUX circuits 222 and 224. A fourth phase MUX circuit 228 selects the remaining two reference clock signals, e.g., $K_R$<6,7>, not selected by the first to third phase MUX circuits 222, 224 and 226.

Each of the phase MUX circuits 222, 224, 226 and 228 selects any one of reference clock signals $K_R$<0,2,4,6> passed through an even-number delay unit of the delay circuit unit 210, and any one of reference clock signals $K_R$<1,3,5,7> passed through an odd-number delay unit of the delay circuit unit 210, from the reference clock signals $K_R$<7:0>. Input sequences of reference clock signals $K_R$<7:0> individually inputted to the phase MUX circuits 222, 224, 226 and 228 become different by considering a phase difference of reference clock signals respectively selected by the phase MUX circuits 222, 224, 226 and 228. For example, when a first reference clock signal $K_R$<0> is inputted as a first input signal to the first phase MUX circuit 222, the first reference clock signal $K_R$<0> is inputted as a fourth input signal to the second phase MUX circuit 224, and is inputted as a third input to the third phase MUX circuit 226, and is inputted as a second input to the fourth phase MUX circuit 228. For the rest of the reference clock signals $K_R$<1,2,3,4,5,6,7>, input sequences are likewise decided, which is to uniformly maintain respective phase differences of one pair of reference clock signals selected by any one phase MUX circuit, e.g., first phase MUX circuit, and of one pair of reference clock signals selected by another adjacent phase MUX circuit, e.g., second phase MUX circuit.

Two reference clock signals as one pair selected by any one of the plurality of phase MUX circuits 222, 224, 226 and 228 may be an input signal and an output signal of any one delay unit selected from the plurality of delay units.

The first to fourth phase MUX circuits 222, 224, 226 and 228 have the same structure, and are controlled by the same selection control signals PEVEN, EVEN, PODD and ODD. Input sequences of the respective reference clock signals $K_R$<7:0> become different for every first to fourth phase MUX circuits, thus each pair of reference clock signals selected and outputted by each of the first to fourth phase MUX circuits 222, 224, 226 and 228 has a phase difference obtained by dividing one period T into equal parts.

Figure 7:
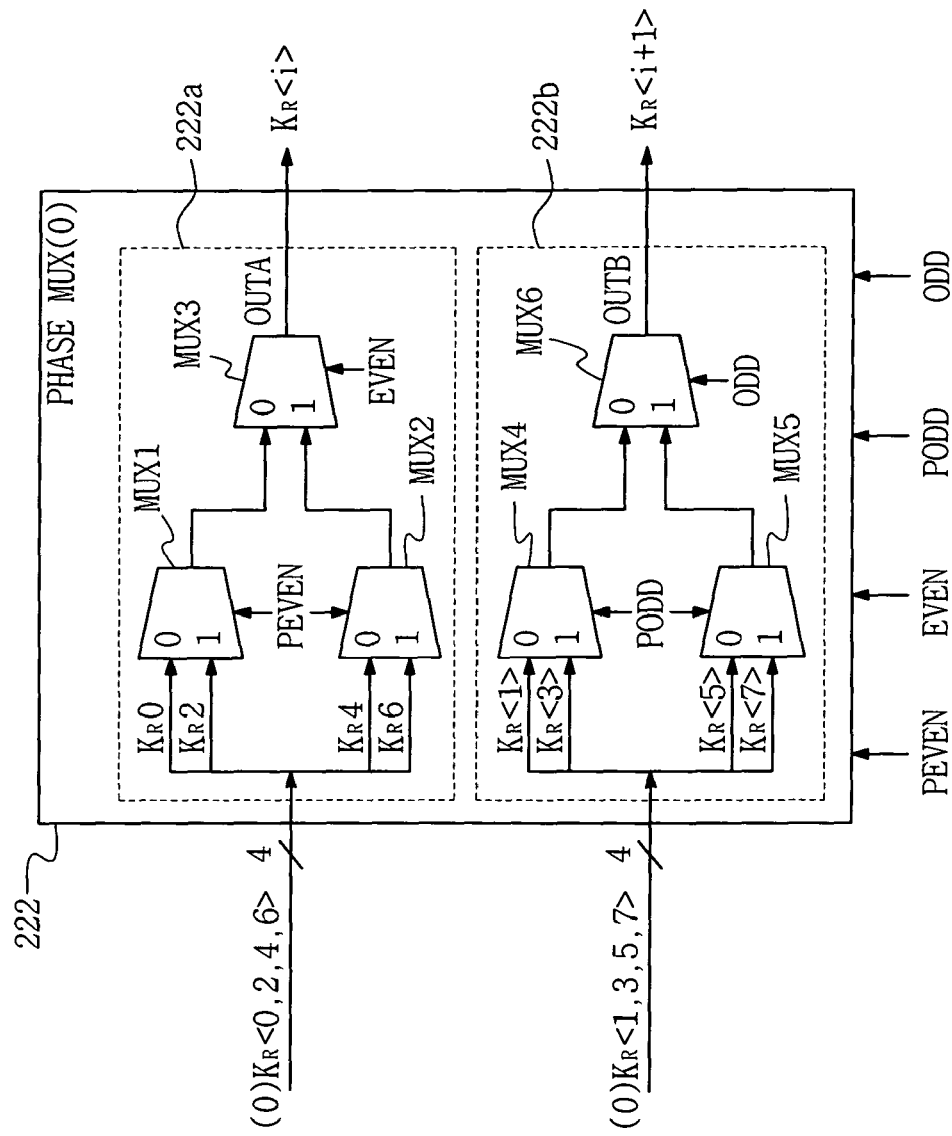
FIG. 7 is a block diagram of a phase MUX circuit shown in FIG. 6.

FIG. 7 is a circuit diagram of first phase MUX circuit 222 as one of the four phase MUX circuits 222, 224, 226 and 228.

As shown in FIG. 7, the first phase MUX circuit 222 includes six 2:1 MUX circuits MUX1 through MUX6, and is constructed of an even MUX circuit 222a and an odd MUX circuit 222b. The even MUX circuit 222a selects any one reference clock signal $K_R<i>$ of reference clock signals $K_R<0,2,4,6>$ passed through an even-number delay unit. The odd MUX circuit 222b selects any one reference clock signal $K_R<i+1>$ of reference clock signals $K_R<1,3,5,7>$ passed through an odd-number delay unit. For example, a first even MUX, MUX1, constituting the even MUX circuit 222a has, as an input, first and third reference clock signals $K_R<0,2>$ of reference clock signals $K_R<0,2,4,6>$ passed through an even-number delay unit, and selects and outputs any one of the first and third reference clock signals $K_R<0,2>$ in response to a selection control signal PEVEN. A second even MUX, MUX2, constituting the even MUX circuit 222a has, as inputs, fifth and seventh reference clock signals $K_R<4,6>$ of reference clock signals $K_R<0,2,4,6>$ passed through an even-number delay unit, and selects and outputs any one of the fifth and seventh reference clock signals $K_R<4,6>$ in response to a selection control signal PEVEN. A third even MUX, MUX3, has, as inputs, respective output signals outputted from the first even MUX, MUX1, and the second even MUX, MUX2, and selects and outputs any one $K_R<i>$ of output signals of the first even MUX, MUX1, and the second even MUX, MUX2, in response to a selection control signal EVEN.

A first odd MUX, MUX4, constituting the odd MUX circuit 222b has, as inputs, second and fourth reference clock signals $K_R<1,3>$ of reference clock signals $K_R<1,3,5,7>$ passed through an odd-number delay unit, and selects and outputs any one of the second and fourth reference clock signals $K_R<1,3>$ in response to a selection control signal PODD. A second odd MUX, MUX5, constituting the odd MUX circuit 222b has, as inputs, sixth and eighth reference clock signals $K_R<5,7>$ of reference clock signals $K_R<1,3,5,7>$ passed through an odd-number delay unit, and selects and outputs any one of the sixth and eighth reference clock signals $K_R<5,7>$ in response to a selection control signal PODD. A third odd MUX, MUX6, has, as inputs, respective output signals outputted from the first odd MUX, MUX4, and the second odd MUX, MUX5, and selects and outputs any one $K_R<i+1>$ of output signals of the first odd MUX, MUX4, and the second odd MUX, MUX5, in response to a selection control signal ODD.

Figure 8:
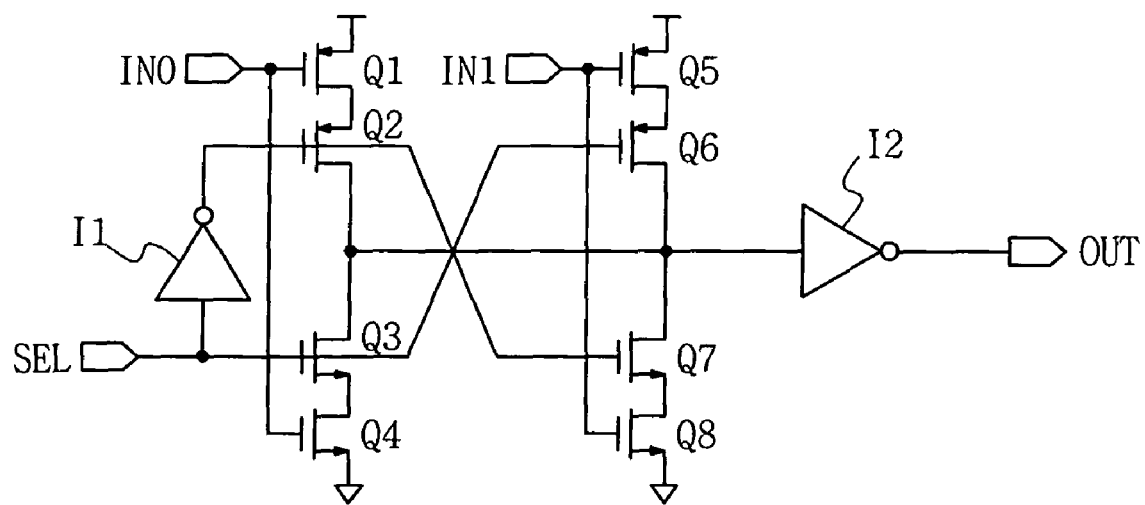
FIG. 8 is a circuit diagram of a MUX circuit shown in FIG. 7.

The six 2:1 MUXs, MUX1 to MUX6, may have the same structure, and a circuit diagram for them is shown in FIG. 8. With reference to FIG. 8, each of the MUX circuits MUX1 to MUX6 is constructed of eight MOS transistors Q1 to Q8 and two inverter circuits I1 and I2.

The MUX circuit includes a first P-channel Metal Oxide Semiconductor (PMOS) transistor Q1 of which one end is connected to a power source voltage terminal and of which a gate receives a first input IN0; a second PMOS transistor Q2, which is connected to the first PMOS transistor Q1 in series and of which a gate receives an inverting signal of selection control signal SEL; a first NMOS transistor Q3, which is connected to the second PMOS transistor Q2 in series and of which a gate receives the selection control signal SEL; and a second NMOS transistor Q8, which is connected between the first NMOS transistor Q3 and a ground terminal and of which a gate receives a first input IN0. Also the MUX circuit includes a third PMOS transistor Q5 of which one end is connected to a power source voltage terminal and of which a gate receives a second input IN1; a fourth PMOS transistor Q6, which is connected to the third PMOS transistor Q5 in series and of which a gate receives a selection control signal SEL; a third NMOS transistor Q7, which is connected to the fourth PMOS transistor Q6 in series and of which a gate receives an inverting signal of the selection control signal SEL; and a fourth NMOS transistor Q8, which is connected between the third NMOS transistor Q7 and a ground terminal and of which a gate receives a second input IN1.

Referring back to FIG. 6, the interpolation unit 230 includes a plurality of phase interpolators, e.g., first to fourth interpolator circuits 232, 234, 236 and 238, for independently outputting transmission core clock signals K<0>, K<1>, K<2> and K<3> having a specific phase provided between the selected two reference clock signals, respectively, in response to the same applied interpolator control signals VCNA and VCNB.

The first interpolator circuit 232 interpolates two reference clock signals, e.g., $K_R<0,1>$, outputted from the first phase MUX circuit 222, and outputs a first transmission core clock signal K<0>. The second interpolator circuit 234 interpolates two reference clock signals, e.g., $K_R<2,3>$, outputted from the second phase MUX circuit 224, and outputs a second transmission core clock signal K<1>. The third interpolator circuit 236 interpolates two reference clock signals, e.g., $K_R<4,5>$, outputted from the third phase MUX circuit 226, and outputs a third transmission core clock signal K<2>. The fourth interpolator circuit 238 interpolates two reference clock signals, e.g., $K_R<6,7>$, outputted from the fourth phase MUX circuit 228, and outputs a fourth transmission core clock signal K<3>. The first to fourth interpolator circuits 232, 234, 236 and 238 are controlled by the same interpolator control signals VCNA and VCNB, thus the first to fourth transmission core clock signals K<0>, K<1>, K<2> and <K<3> have a phase difference distributed equally. For example, the first transmission core clock signal K<0> and the second transmission core clock signal K<1>, the second transmission core clock signal K<1> and the third transmission core clock signal K<2>, the third transmission core clock signal K<2> and the fourth transmission core clock signal K<3>, and the fourth transmission core clock signal K<3> and the first transmission core clock signal K<1>, may individually have a phase difference of 90 degrees. In other words, in a state where the DLL is locked, the first to fourth transmission core clock signals K<0>, K<1>, K<2> and <K<3> individually have a phase of 0, T/4, T/2, ¾ on the basis of one period T.

The phase detector 250 compares a phase of a transmission core clock signal, e.g., K<0>, outputted from any one interpolator circuit, e.g., first interpolator circuit 232, selected from the interpolator circuits 232, 234, 236 and 238, with a phase of the external clock signal C,C#, and outputs a detection signal PHADV corresponding to its phase difference. That is, the transmission core clock signal K<0> is compared with the external clock signal C,C#, and it is decided whether their delay or phase difference is larger or smaller than a desired amount, and its result value is transmitted to the controller 260. A phase detection circuit constituting the phase detector 250 may be constructed of an edge triggered latch circuit.

The controller 260 generates the selection control signals PEVEN, EVEN, PODD and ODD and the interpolator control signals VCNA and VCNB in response to a detection signal PHADV of the phase detector 250. The controller 260 includes an Final State Machine (FSM) circuit having a counter, to generate the selection control signals PEVEN, EVEN, PODD and ODD in response to a detection signal PHADV of the phase detector 250; and a D/A converter circuit for generating the interpolator control signals VCNA and VCNB in response to a portion of output signals outputted from the counter of the FSM circuit.

For example, the FSM circuit has an 8-bit counter, and generates the selection control signals PEVEN, EVEN, PODD and ODD by using an upper 3 bits. The selection control signals PEVEN, EVEN, PODD and ODD perform a control to select one pair of reference clock signals most approximate to the external clock signal C,C# from inputs of the first phase MUX circuit 222. The D/A converter circuit generates interpolator control signals VCNA and VCNB to control the interpolator circuits 232, 234, 236 and 238 of the interpolation unit 230, by using the lower 5 bits of information from outputs of the counter. For example, when the interpolator control signals VCNA and VCNB are inputted to first interpolator circuit 232, the first interpolator circuit 232 equally divides a phase value provided between the two inputted reference clock signals into a plural number, and generates one transmission core clock signal K<0> having an optional phase value from them. Thus the transmission core clock signal K<0> outputted from the first interpolator circuit 232 has a phase most approximate to the external clock signal C,C#.

When any one phase MUX circuit, e.g., first phase MUX circuit 222, selects a third reference clock signal $K_R$<2> and a fourth reference clock signal $K_R$<3> and interpolates them, then if a detection signal PHADV of phase detector 250 continuously sends information of requiring a phase increase in spite of a phase change of even fourth reference clock signal $K_R$<3>, the FSM circuit generates selection control signals PEVEN, EVEN, PODD and ODD so that the first phase MUX circuit 222 selects a fourth reference clock signal $K_R$<3> and a fifth reference clock signal $K_R$<4>. Thus the first phase MUX circuit 222 selects the fourth reference clock signal $K_R$<3> and the fifth reference clock signal $K_R$<4>, and these signals are inputted to the first interpolator circuit 232. Accordingly, values of the interpolator control signals VCNA and VCNB are changed.

That is, when the third reference clock signal $K_R$<2> and the fourth reference clock signal $K_R$<3> are inputted to the first interpolator circuit 232, the interpolator control signal VCNA firstly has a highest voltage level Vs among outputs of the D/A converter circuit, and the interpolator control signal VCNB has a voltage of 0V, and then the voltage of the interpolator control signal VCNA is increasingly reduced to a level of 0V, and the interpolator control signal VCNB increasingly increases to a highest voltage level Vs among outputs of the D/A converter circuit. Then, when the fourth reference clock signal $K_R$<3> and the fifth reference clock signal $K_R$<4> are interpolated, the interpolator control signal VCNB has a highest voltage level Vs of outputs from the D/A, and the interpolator control signal VCNA has a voltage of 0V, and then, the interpolator control signal VCNB is increasingly reduced to 0V level, and the interpolator control signal VCNA increasingly increases to a highest voltage level Vs of outputs from the D/A converter circuit. The interpolation operation is performed through such procedures.

The DLL circuit does not have a DCC circuit as described above, contrary to the conventional approach. This is why transmission core clock signals necessary for a semiconductor memory device are individually generated through independent circuits and so there is no need to correct a duty cycle, thus there is no possibility for a corresponding error occurrence, and an error occurrence caused by a lengthened clock tree is reduced.

Figure 9:
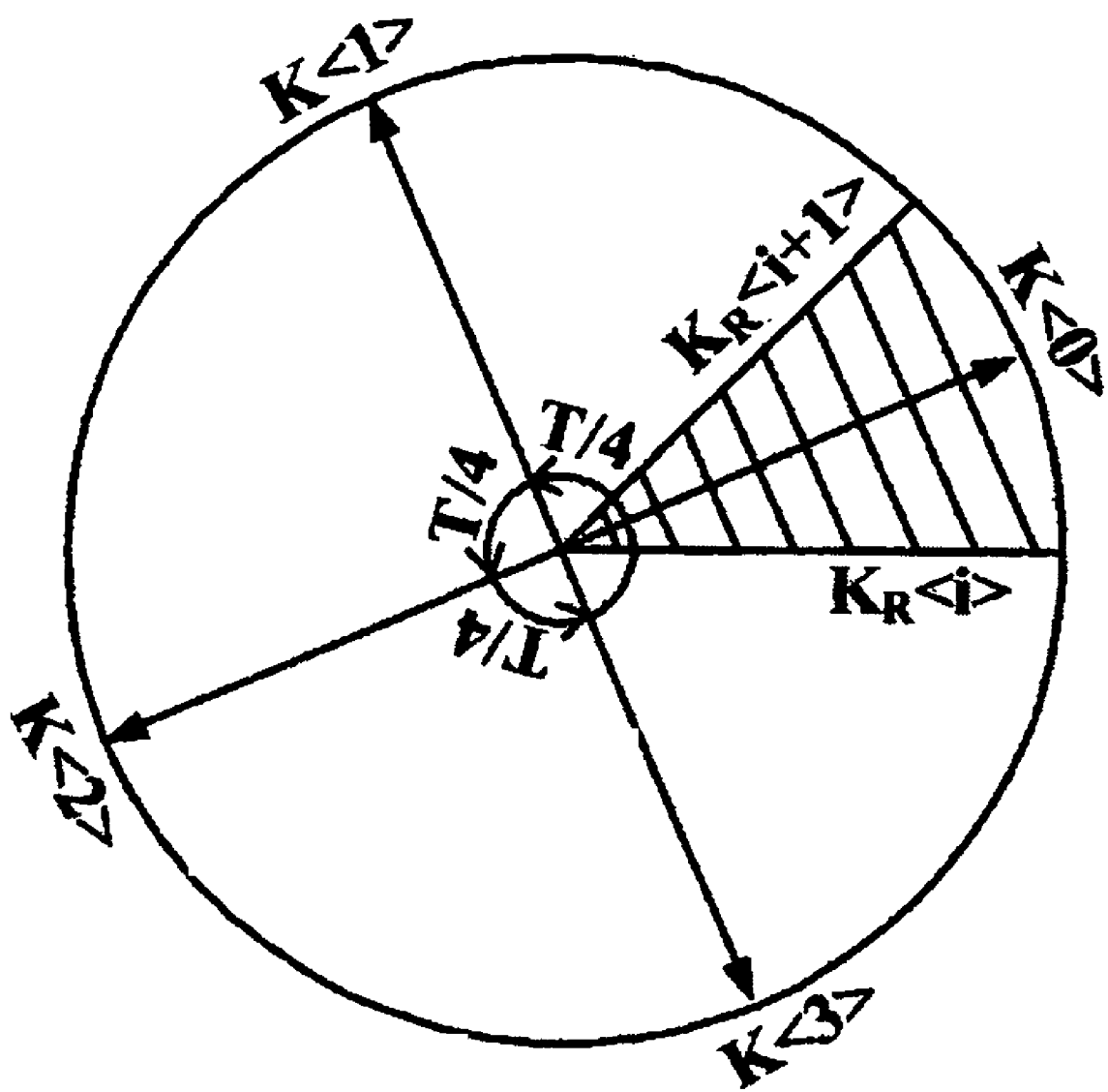
FIG. 9 is a phase diagram of a transmission core clock signal shown in FIG. 6.

FIG. 9 is a phase diagram of transmission core clock signals shown in FIG. 6. As shown in FIG. 9, when two optional reference clock signals $K_R$<i> and $K_R$<i+1> are interpolated and a first transmission core clock signal K<0> is generated, a second transmission core clock signal K<1> having a phase difference of 90 degrees precisely from the first transmission core clock signal K<0> is generated at the same time, because the phase MUX unit 220 and the interpolation unit 230 are controlled by the same control signals. Further a third transmission core clock signal K<2> having a phase difference of 180 degrees from the first transmission core clock signal K<0> and having a phase difference of 90 degrees from the second transmission core clock signal K<1> is generated simultaneously. Also simultaneously, a fourth transmission core clock signal K<3>, which has a phase difference of 270 degrees from the first transmission core clock signal K<0>, 180 degrees from the second transmission core clock signal K<1> and 90 degrees from the third transmission core clock signal K<2>, is generated.

Figure 10:
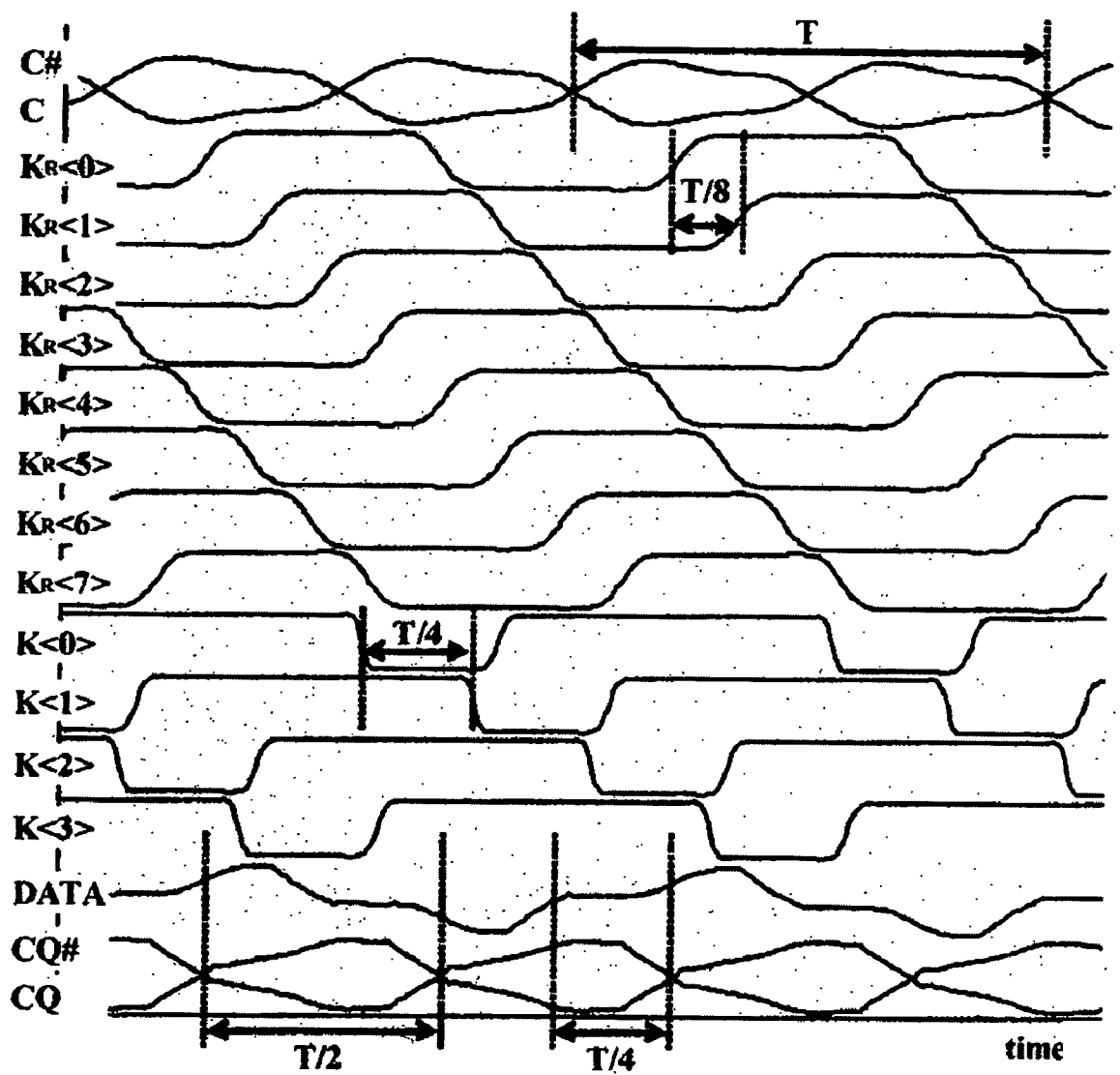
FIG. 10 illustrates timings of clock signals shown in FIG. 6.

FIG. 10 is a timing diagram of clock signals shown in FIG. 6. Referring to FIG. 10, an external clock signal C,C# is inputted with a determined period T. The period of external clock signal C,C# is divided into equal parts and so respectively delayed reference clock signals $K_R$<0>, $K_R$<1>, $K_R$<2>, $K_R$<3>, $K_R$<4>, $K_R$<5>, $K_R$<6> and $K_R$<7> are generated. The reference clock signals have a phase difference or delay difference of T/8 from adjacent reference clock signals.

The reference clock signals $K_R$<0>, $K_R$<1>, $K_R$<2>, $K_R$<3>, $K_R$<4>, $K_R$<5>, $K_R$<6> and $K_R$<7> are individually selected by the phase MUX unit 220, and are interpolated by the interpolation unit 230, thus first through fourth transmission core clock signals K<0>, K<2>, K<2> and K<3> are generated. The first transmission core clock signal K<0> is generated by selecting a third reference clock signal $K_R$<2> and a fourth reference clock signal $K_R$<3> from the reference clock signals $K_R$<0>, $K_R$<1>, $K_R$<2>, $K_R$<3>, $K_R$<4>, $K_R$<5>, $K_R$<6> and $K_R$<7>, and by interpolating them. The second transmission core clock signal K<1> is generated by selecting a fifth reference clock signal $K_R$<4> and a sixth reference clock signal $K_R$<5> from the reference clock signals $K_R$<0>, $K_R$<1>, $K_R$<2>, $K_R$<3>, $K_R$<4>, $K_R$<5>, $K_R$<6> and $K_R$<7>, and by interpolating them. The third transmission core clock signal K<2> is generated by selecting a seventh reference clock signal $K_R$<6> and an eighth reference clock signal $K_R$<7> from the reference clock signals $K_R$<0>, $K_R$<1>, $K_R$<2>, $K_R$<3>, $K_R$<4>, $K_R$<5>, $K_R$<6> and $K_R$<7>, and by interpolating them. The fourth transmission core clock signal K<3> is generated by selecting a first reference clock signal $K_R$<0> and a second reference clock signal $K_R$<1> from the reference clock signals $K_R$<0>, $K_R$<1>, $K_R$<2>, $K_R$<3>, $K_R$<4>, $K_R$<5>, $K_R$<6> and $K_R$<7>, and by interpolating them.

Accordingly, data begins to be transmitted and received in response to a falling edge of the first transmission core clock signal K<0>, and the center of the data is placed at a falling edge time point of second transmission core clock signal K<1> provided as a rising edge or falling edge time point of echo clock CQ,CQ\.

A transmission/reception of next data begins in response to a falling edge of the third core clock signal K<2> whose phase is later by 90 degrees than that of the second core clock signal K<1>, and the center of the second data is placed at a falling edge time point of the fourth core clock signal K<3> whose phase is later by 90 degrees than that of the third core clock signal K<2>, or at a rising edge or falling edge time point of the echo clock CQ,CQ\, thereby a sampling of data can be performed precisely.

In a DLL circuit according to an exemplary embodiment of the disclosure as described above, the loop circuit is configured without employing a DCC, thus substantially reducing an error occurrence. Transmission core clock signals are individually controlled by the same control signals, and a required number of transmission core clock signals are generated independently, thereby obtaining a precise phase difference and reducing an error occurrence. Further, a generation case of four transmission core clock signals was provided in the above description of the disclosure, but needless to say, it can be known by those of ordinary skill in the pertinent art that a DLL circuit can be configured to generate more transmission core clock signals.

As described above, according to an exemplary embodiment of the disclosure, a DLL circuit is configured without employing a DCC circuit, thereby reducing an error occurrence of a DCC circuit itself and a phase error caused by a lengthened clock tree. In addition, a control for phase MUX circuits and phase interpolator circuits is easy through a control of the same control signals, thereby generating transmission core clock signals having a precise phase difference.

While the present disclosure has been particularly shown and described with reference to exemplary embodiments thereof, it will be understood by those of ordinary skill in the pertinent art that various changes in form and details may be made therein without departing from the spirit and scope of the present invention as defined by the appended claims. For example, an internal configuration of the circuit can be changed or internal components can be replaced with other equivalent elements. Accordingly, these and other changes and modifications are seen to be within the true spirit and scope of the invention as defined by the appended claims.

What is claimed is:

1. A delay-locked loop (DLL) circuit for receiving an applied external clock signal and generating four transmission core clock signals for use in a double data rate system, the circuit comprising:
   a delay circuit unit for delaying the external clock signal through a plurality of delay units configured in a chain, and outputting a plurality of reference clock signals having different respective phases,
   wherein the plurality of delay units constituting the delay circuit unit individually perform an equal division for a delay time corresponding to a period of the external clock signal, and individually perform the delays; and
   a transmission core clock signal generating unit for selecting pairs of the plurality of reference clock signals from the plurality of reference clock signals, and generating the four transmission core clock signals where each transmission core clock signal is responsive to a pair of the reference clock signals, the number of transmission core clock signals corresponding to one half times the number of reference clock signals, each of the four transmission core clock signals having the same phase offset relative to its pair of selected reference clock signals, respectively, and the transmission core clock signals each having different phases from each other and a period substantially equal to a period of the external clock signal,
   wherein transmission of data occurs at a high to low transition of each of the four transmission core clock signals, and
   wherein the transmission core clock signal generating unit comprises:
   a phase multiplexer (MUX) unit having four phase MUX circuits, each phase MUX circuit for independently selecting and outputting two reference clock signals most approximate to the external clock signal from the plurality of reference clock signals, respectively, in response to the same selection control signals applied to each of the four phase MUX circuits;
   an interpolation unit having four phase interpolators, each phase interpolator for directly outputting one transmission core clock signal having a specific phase provided between the selected two reference clock signals from the four phase MUX circuits, respectively, in response to the same interpolator control signals applied to each of the four phase interpolators, such that at the same time:
   a second transmission core clock signal has a phase difference of 90° degrees from the first transmission core clock signal,
   a third transmission core clock signal has a phase difference of 180° degrees from the first transmission core clock signal and has a phase difference of 90° degrees from the second transmission core clock signal, and
   a fourth transmission core clock signal has a phase difference of 270° degrees from the first transmission core clock signal, 180° degrees from the second transmission core clock signal and 90° degrees from the third transmission core clock signal,
   wherein the four transmission core clock signals form outputs of the delay-locked loop circuit, such that first data is transmitted and received in response to a falling edge of the first transmission core clock signal, the center of the first data is at a falling edge time point of the second transmission core clock signal, and next data is transmitted and received in response to a falling edge of the third transmission core clock signal and the center of the next data is at a falling edge time point of the fourth transmission core clock signal,
   a phase detector directly connected to the transmission core clock signal from one of the four phase interpolators for comparing a phase of the transmission core clock signal outputted from one of the four phase interpolators with a phase of the external clock signal, and outputting a detection signal corresponding to its phase difference; and
   a controller for generating the selection control signals applied to the four phase MUX circuits and the interpolator control signals applied to the four phase interpolators in response to a detection signal of the phase detector.

2. The circuit of claim 1, wherein each of the four phase MUX circuits selects any one of reference clock signals passed through an even-number delay unit of the delay circuit unit, and any one of reference clock signals passed through an odd-number delay unit of the delay circuit unit, from the reference clock signals.

3. The circuit of claim 2, wherein the two reference clock signals selected by any one of the four phase MUX circuits are an input signal and an output signal of any one delay unit selected from the plurality of delay units.

4. The circuit of claim 3, wherein the DLL is applied to a semiconductor memory device having a Double Data Rate (DDR) function.

5. The circuit of claim 4, wherein the controller comprises a Final State Machine (FSM) circuit that has a counter and that generates the selection control signals in response to a detection signal of the phase detector; and a Digital-to-Analog (D/A) converter circuit for generating the interpolator control signals in response to a portion of output signals outputted from the counter of the FSM circuit.

6. The circuit of claim 1, wherein each transmission core clock signal has substantially the same uncorrected duty cycle as the other transmission core clock signals.

7. A DLL circuit for receiving an external clock signal and generating four transmission core clock signals for use in a double data rate system, the circuit comprising:
a delay circuit unit having eight delay units that is configured in a chain type to equally divide a delay time corresponding to a period of the external clock signal and to perform the delays, the delay circuit unit being for generating each of first to eighth reference clock signals having different respective phases after the external clock signal is passed through the respective delay units;
a phase MUX unit having first, second, third and fourth phase MUX circuits, where the first phase MUX circuit selects two reference clock signals having a phase difference most approximate to the external clock signal from the reference clock signals in response to selection control signals, the second phase MUX circuit selects two reference clock signals having a phase difference most approximate to the external clock signal from the rest of the reference clock signals not selected by the first phase MUX circuit in response to the selection control signals, the third phase MUX circuit selects two reference clock signals having a phase difference most approximate to the external clock signal from the rest of the reference clock signals not selected by the first and second phase MUX circuits in response to the selection control signals, and the fourth phase MUX circuit selects the remaining two reference clock signals not selected by the first to third phase MUX circuits in response to the selection control signals, the first to fourth phase MUX circuits having the same structure and being controlled by the same selection control signals;
an interpolation unit having first, second, third and fourth phase interpolator circuits, where the first phase interpolator circuit interpolates two reference clock signals outputted from the first phase MUX circuit and directly outputs a first transmission core clock signal in response to interpolator control signals, the second phase interpolator circuit interpolates two reference clock signals outputted from the second phase MUX circuit and directly outputs a second transmission core clock signal in response to interpolator control signals, the third phase interpolator circuit interpolates two reference clock signals outputted from the third phase MUX circuit and directly outputs a third transmission core clock signal, and the fourth phase interpolator circuit interpolates two reference clock signals outputted from the fourth phase MUX circuit and directly outputs a fourth transmission core clock signal in response to interpolator control signals, the first to fourth phase interpolator circuits being controlled by the same interpolator control signals, wherein transmission of data occurs at a high to low transition of each of the first, second, third, and fourth transmission core clock signals, and wherein the first, second, third and fourth transmission core clock signals form outputs of the DLL circuit, such that at the same time:
the second transmission core clock signal has a phase difference of 90° degrees from the first transmission core clock signal,
the third transmission core clock signal has a phase difference of 180° degrees from the first transmission core clock signal and has a phase difference of 90° degrees from the second transmission core clock signal, and
the fourth transmission core clock signal has a phase difference of 270° degrees from the first transmission core clock signal, 180° degrees from the second transmission core clock signal and 90° degrees from the third transmission core clock signal, and such that:
first data is transmitted and received in response to a falling edge of the first transmission core clock signal,
the center of the first data is at a falling edge time point of second transmission core clock signal,
next data is transmitted and received in response to a falling edge of the third transmission core clock signal, and
the center of the next data is at a falling edge time point of the fourth transmission core clock signal;
a phase detector directly connected to first phase interpolator circuit for comparing phases of the first transmission core clock signal and the external clock signal, and outputting a detection signal corresponding to its phase difference; and
a controller for generating the selection control signals and the interpolator control signals in response to a detection signal of the phase detector.

8. The circuit of claim 7, wherein the first and second reference clock signals, the second and third reference clock signals, the third and fourth reference clock signals, the fourth and fifth reference clock signals, the fifth and sixth reference clock signals, the sixth and seventh reference clock signals, the seventh and eighth reference clock signals, and the eighth and first reference clock signals, individually have a phase difference of 45 degrees.

9. The circuit of claim 8, wherein each of the first to fourth phase MUX circuits selects any one of even-number reference clock signals from the reference clock signals, and any one of odd-number reference clock signals from the reference clock signals.

10. The circuit of claim 9, wherein two reference clock signals selected by any one of the first to fourth phase MUX circuits are an input signal and an output signal of any one delay unit selected from the eight delay units.

11. The circuit of claim 10, wherein the DLL is applied to a semiconductor memory device having a DDR function.

12. The circuit of claim 11, wherein the controller comprises an FSM circuit that has a counter and that generates the selection control signals in response to a detection signal of the phase detector; and a D/A converter circuit for generating the interpolator control signals in response to a portion of output signals outputted from the counter of the FSM circuit.

13. The circuit of claim 12, wherein the first and second transmission core clock signals, the second and third transmission core clock signals, the third and fourth transmission core clock signals, and the fourth and first transmission core clock signals, individually have a phase difference of 90 degrees.

14. The circuit of claim 7, wherein each transmission core clock signal has substantially the same uncorrected duty cycle as the other transmission core clock signals.

15. A method of receiving an external clock signal and generating four transmission core clock signals in a DLL circuit for use in a double data rate system, the method comprising:
delaying the external clock signal through each of a plurality of delay units, and generating a plurality of reference clock signals output from the delay units, wherein the plurality of reference clock signals have different respective phases; and
respectively selecting pairs of reference clock signals having phases most approximate to the external clock signal from the plurality of reference clock signals, interpolating between each pair of reference clock signals, and separately generating four transmission core clock signals, each transmission core clock signal corresponding to a different pair of reference clock signals, each transmission core clock signal having a different phase than the other transmission core clock signals, each transmission core clock signal having substantially the same period as the external clock signal, and each transmission core clock signal having substantially the same uncorrected duty cycle as the other transmission core clock signals, such that at the same time:

a second transmission core clock signal has a phase difference of 90° degrees from the first transmission core clock signal, a third transmission core clock signal has a phase difference of 180° degrees from the first transmission core clock signal and has a phase difference of 90° degrees from the second transmission core clock signal, and a fourth transmission core clock signal has a phase difference of 270° degrees from the first transmission core clock signal, 180° degrees from the second transmission core clock signal and 90° degrees from the third transmission core clock signal, and such that:

first data is transmitted and received in response to a falling edge of the first transmission core clock signal, the center of the data is at a falling edge time point of second transmission core clock signal, next data is transmitted and received in response to a falling edge of the third transmission core clock signal, and the center of the next data is at a falling edge time point of the fourth transmission core clock signal;

wherein transmission of data occurs at a high to low transition of each of the four core clock signals.

16. The method of claim 15, wherein through the plurality of delay units, a delay time corresponding to a period of the external clock signal is divided into equal parts and the delays are performed respectively.

17. The method of claim 16, wherein the two reference clock signals selected from the plurality of reference clock signals are any one of reference clock signals passed through an even-number delay unit of the plurality of delay units, and any one of reference clock signals passed through an odd-number delay unit.

18. The method of claim 17, wherein the two selected reference clock signals are an input signal and an output signal of any one delay unit selected from the plurality of delay units.

19. The method of claim 18, wherein the transmission core clock signals are applied to a semiconductor memory device having a DDR function.

20. The method of claim 15 wherein the plurality of transmission core clock signals corresponds to ½ times the number of reference clock signals, and each of the plurality of transmission core clock signals has a different phase and a period substantially equal to a period of the external clock signal.

* * * * *